US008188894B2

(12) United States Patent
Chin et al.

(10) Patent No.: US 8,188,894 B2
(45) Date of Patent: May 29, 2012

(54) DEVICES FOR CONVERSION BETWEEN SERIAL AND PARALLEL DATA

(75) Inventors: Chung Kuang Chin, Saratoga, CA (US); Prasad Paranjape, Fremont, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 12/495,482

(22) Filed: Jun. 30, 2009

(65) Prior Publication Data

US 2010/0328116 A1     Dec. 30, 2010

(51) Int. Cl.
*H03M 9/00* (2006.01)
(52) U.S. Cl. ........................................ 341/100; 341/101
(58) Field of Classification Search ................... 341/100, 341/101
See application file for complete search history.

(56) References Cited

U.S. PATENT DOCUMENTS

| 5,291,515 | A  | * | 3/1994  | Uchida et al. ............... 375/142 |
|-----------|----|---|---------|---------------------------------------|
| 5,887,039 | A  | * | 3/1999  | Suemura et al. ............. 375/365  |
| 6,556,045 | B2 | * | 4/2003  | Cohen ............................ 326/46 |
| 6,728,298 | B1 | * | 4/2004  | Okubo et al. ................ 375/146  |
| 6,904,062 | B1 | * | 6/2005  | Tng et al. .................... 370/537 |
| 6,937,681 | B2 | * | 8/2005  | Watanabe ..................... 375/371 |
| 6,985,096 | B1 | * | 1/2006  | Sasaki et al. ................. 341/100 |
| 7,009,964 | B2 | * | 3/2006  | Fisher et al. ................. 370/363 |
| 7,277,644 | B2 | * | 10/2007 | Johnson et al. ............. 398/158  |
| 7,310,479 | B2 | * | 12/2007 | Lee et al. ..................... 398/45 |
| 7,760,116 | B2 | * | 7/2010  | Liu et al. ..................... 341/100 |
| 2003/0026201 | A1 | * | 2/2003 | Arnesen ...................... 370/210 |
| 2006/0038599 | A1 | * | 2/2006 | Avants et al. ................ 327/276 |

* cited by examiner

*Primary Examiner* — Linh Nguyen
(74) *Attorney, Agent, or Firm* — Harrity & Harrity LLP; David L. Soltz

(57) ABSTRACT

Serial-to-parallel and parallel-to-serial conversion devices may provide for efficient conversion of serial bit streams into parallel data units (and vice versa). In one implementation, a device may include delay circuits, each of which being configured to receive a serial data stream. A rotator circuit may receive the delayed serial data streams and rearrange bits in the serial data streams. Register circuits may receive the output of the rotator circuit and collectively output, in parallel, a number of bits of one of the serial bit streams.

17 Claims, 17 Drawing Sheets

DEVICES FOR CONVERSION BETWEEN SERIAL AND PARALLEL DATA

BACKGROUND

Optical networks transmit data over optical fiber. In an optical network, multiplexing protocols such as Synchronous optical networking (SONET) and Synchronous Digital Hierarchy (SDH) may be used to transfer multiple digital bit streams over the same optical fiber. Lasers or light-emitting diodes (LEDs) may used to generate the optical carriers.

Bit streams traversing an optical network may pass through transponder switches. Such a switch may, for example, connect to multiple different fiber ports. Bit streams may be received at the switch, converted to an electrical signal, switched to the appropriate output port based on the electrical signal, converted back to an optical signal, and output as an optical signal on the determined output port.

The switching of an optical signal between ports in the transponder switch may involve the conversion of a serial bit stream into parallel chunks of data that are written to a memory. The data for the bit stream may subsequently be read out of the memory on a path corresponding to the determined output port and converted back to a serial stream. As the bandwidth of the transponder switch increases, the design and layout complexity of the switching circuitry may increase.

SUMMARY

According to one implementation, a serial-to-parallel device may include a number of inputs, each of which is configured to receive a corresponding one of a number of serial data streams, each of the serial data streams including a corresponding one of a number of data units that each include a number of bits. The device may additionally include a number of delay circuits, each of which being configured to receive a corresponding one of the serial data streams. The device may additionally include a rotator circuit to receive the serial data streams, each of the serial data streams being delayed relative to one another by a corresponding one of a number of delay times associated with the delay circuits, the rotator circuit having a number of outputs, where each of the bits within each of the data units is supplied to a corresponding one of the outputs of the rotator circuits. The device may further include register circuits to receive the data units of the serial data streams, the register circuits being configured to output, in parallel, each of the bits within each of the data units.

According to another implementation, a parallel-to-serial conversion device may comprise an input configured to receive a parallel data unit that includes a number of bits; a number of register circuits to each receive one of the bits of the data unit, store the bit, and output a second, previously received, bit; and a rotator circuit configured to receive the output bits from the registers circuits, the rotator circuit having a number of outputs, where each of the bits within the parallel data unit is supplied sequentially to one of the outputs of the rotator circuit. The device may further include delay circuits to delay received data, each of the delay circuits being connected to a corresponding one of the outputs of the rotator circuit.

In yet another implementation, a switch may comprise a plurality of input signal lines to carry serial data. The switch may further include a serial-to-parallel conversion component that includes a rotator circuit connected to the input signal lines and to output a corresponding number of rotator output signal lines, the rotator circuit switching signals on the input signal lines to various ones of the rotator output signal lines. The serial-to-parallel conversion component may further include register circuits each connected to one of the rotator output signal lines, and to store a bit received on the one of the rotator output signal lines, and output a second, previously received, bit from the rotator circuit. The switch may further include a memory to receive outputs from the registers and store the outputs from the registers as a parallel data unit. The switch may further include a parallel-to-serial conversion component that comprises: register components to each receive a bit from a parallel data unit output from the memory, store the bit, and output a second, previously received, bit, and a second rotator circuit to receive the bits output from the register circuits on a number of second rotator input signal lines and output a corresponding number of second rotator output signal lines, the second rotator component switching signals on the second rotator input signal lines to various ones of the second rotator output signal lines.

In yet another implementation, a device may comprise a number of input signal lines to carry serial data; a rotator circuit to receive the input signal lines and to output a corresponding number of rotator output signal lines, the rotator circuit switching signals on the input signal lines to various ones of the rotator output signal lines. The device may further include registers to each receive one of the rotator output signal lines, store a value received on the rotator output signal line, and output a second, previously received, value from the rotator, where the registers collectively output, at a particular clock cycle, a parallel data unit corresponding to stored values received on one of the plurality of input signal lines.

In yet another implementation, a device may include a number of registers connected to each receive a one-bit value from an input parallel data unit, store the one-bit value, and output a second, previously received, one-bit value, and a rotator component to receive the output one-bit values from the registers on a number of rotator input signal lines and output a corresponding number of rotator output signal lines, the rotator circuit switching signals on the rotator input signal lines to various ones of the rotator output signal lines, where the rotator output signal lines each output, over multiple clock cycles, a serialized versions of the input parallel data unit.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

Implementations, described herein, may provide for efficient conversion of serial bit streams into parallel data units. The parallel data units may be stored in a memory as part of a switch fabric, and then converted back into the original serial bit streams. The serial-to-parallel and parallel-to-serial conversions described herein may be performed using circuitry that requires fewer connections than existing serial-to-parallel and parallel-to-serial circuits, potentially simplifying the circuit layout. This can be particularly desirable as the number of data streams and the desired bus width (i.e., the size of each parallel data unit) increases.

Exemplary Network

Figure 1:
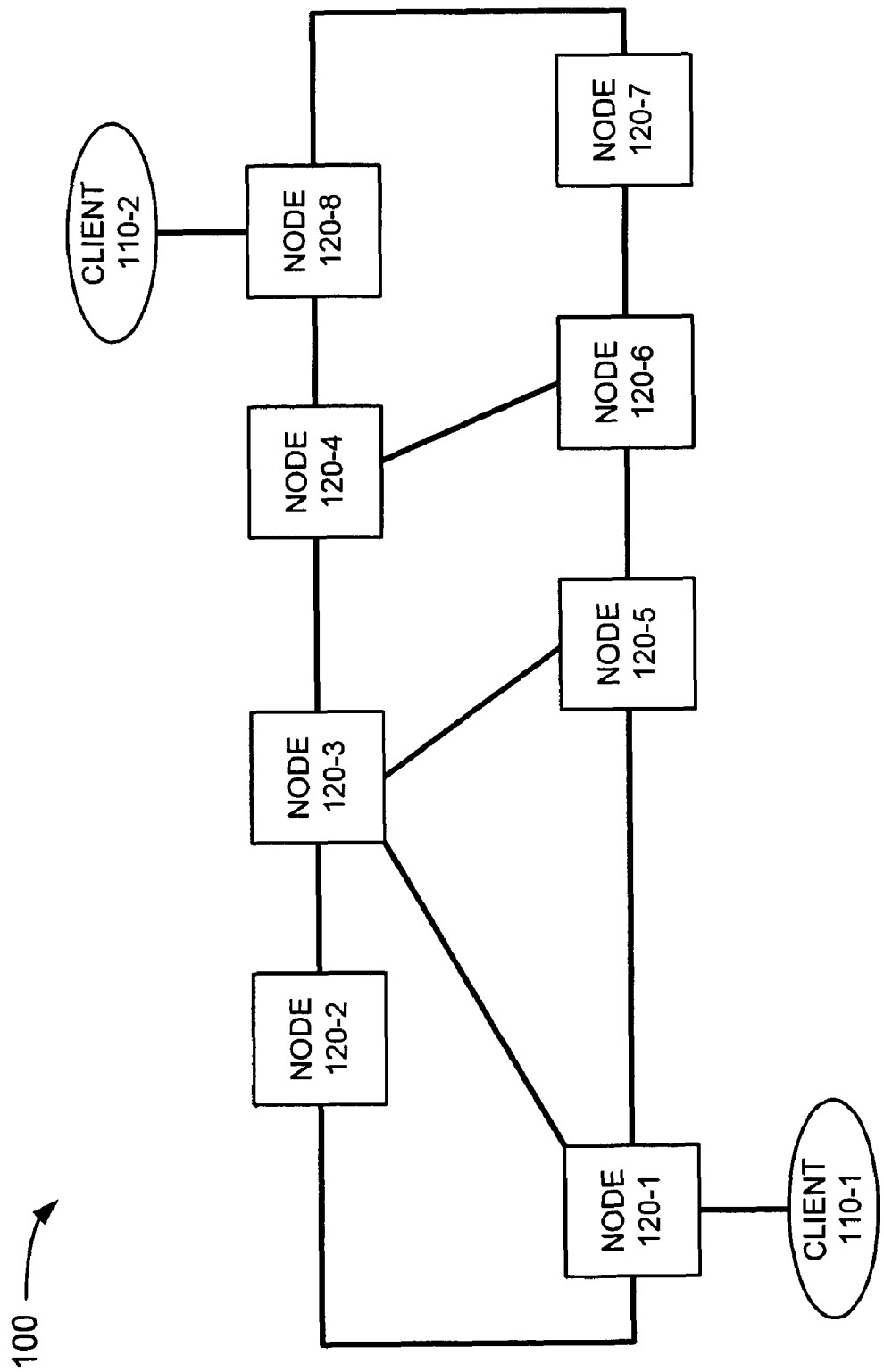
FIG. 1 is a diagram of an exemplary network in which systems and/or methods described herein may be implemented.

FIG. 1 is a diagram of an exemplary network 100 in which systems and/or methods described herein may be implemented. Network 100 may include clients 110-1 and 110-2 (referred to collectively as "clients 110," and generally as "client 110") and nodes 120-1, . . . , 120-8 (referred to collectively as "nodes 120," and generally as "node 120"). While FIG. 1 shows a particular number and arrangement of devices, network 100 may include additional, fewer, different, or differently arranged devices than those illustrated in FIG. 1. Also, the connections between devices may include direct or indirect connections.

Client 110 may include any type of network device, such as a router, a switch, or a central office, that may transmit data traffic. In one implementation, client 110 may transmit a client signal (e.g., a synchronous optical network (SONET) signal, a synchronous digital hierarchy (SDH) signal, an Ethernet signal, or another type of signal) to node 120. The client signal may conform to any payload type, such as Gigabit Ethernet (GbE), 2×GbE, Fibre Channel (FC), 1 GFC, 10 GbE local area network (LAN) physical layer (Phy), 10 GbE wide area network (WAN) Phy, Synchronous Transport Mode 16 (STM-16), STM-64, Optical Carrier level 48 (OC-48), or OC-192.

Nodes 120 may be nodes in an optical network, or an optical portion of a network. Nodes 120 may be connected via optical links. Data traffic may flow from node-to-node over a series of channels/sub-channels forming a path. Any two nodes 120 may connect via multiple optical links. For bidirectional communication, for example, a first optical link may be used for data traffic transmitted in one direction, a second optical link may be used for data traffic transmitted in the opposite direction, and a third optical link may be used in case of a failure on the first link or the second link.

Each node 120 may act as, among other things, an optical switching device in which data is received over an optical link, converted to electrical signals, switched based on the electrical signals, and then output, as an optical signal, to an optical link determined by the switching.

Exemplary Node Components

Figure 2:
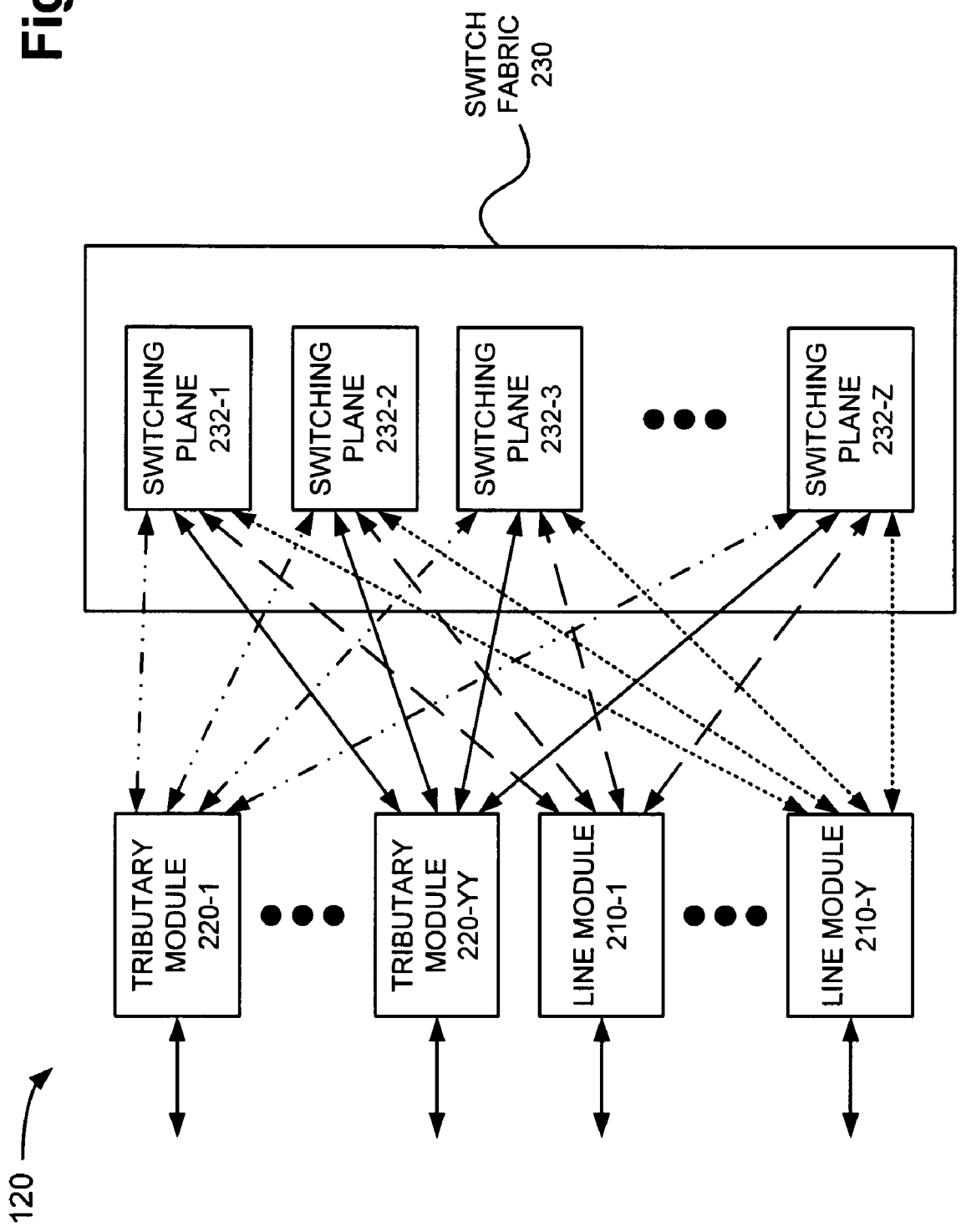
FIG. 2 is a diagram of exemplary components of a node shown in FIG. 1.

FIG. 2 is a diagram of exemplary components of node 120. As shown in FIG. 2, node 120 may include line modules 210-1, . . . , 210-Y (referred to collectively as "line modules 210," and generally as "line module 210") (where Y≧1) and tributary modules 220-1, . . . , 220-YY (referred to collectively as "tributary modules 220," and generally as "tributary module 220") (where YY≧1) connected to a switch fabric 230. As shown in FIG. 2, switch fabric 230 may include switching planes 232-1, 232-2, . . . 232-Z (referred to collectively as "switching planes 232," and generally as "switching plane 232") (where Z≧1). While FIG. 2 shows a particular number and arrangement of components, node 120 may include additional, fewer, different, or differently arranged components than those illustrated in FIG. 2. Also, it may be possible for one of the components of node 120 to perform a function that is described as being performed by another one of the components.

Line module 210 may include hardware components, or a combination of hardware and software components, that may provide network interface operations. Line module 210 may receive a multi-wavelength optical signal and/or transmit a multi-wavelength optical signal. A multi-wavelength optical signal may include a number of optical signals of different optical wavelengths. In one implementation, line module 210 may perform retiming, reshaping, regeneration, time division multiplexing, and/or recoding services for each optical wavelength. Line module 210 may also convert input optical signals into signals represented as electrical signals.

Tributary module 220 may include hardware components, or a combination of hardware and software components, that may support flexible adding-dropping of multiple services, such as SONET/SDH services, GbE services, optical transport network (OTN) services, and FC services. Tributary module 220 may be particularly used to connect nodes 120 to clients 110. Tributary module 220 may also convert input optical signals into signals represented as electrical signals.

Switch fabric 230 may include hardware components, or a combination of hardware and software components, that may provide switching functions to transfer data between line modules 210 and/or tributary modules 220. In one implementation, switch fabric 230 may provide fully non-blocking transfer of data. Each switching plane 232 may be programmed to transfer data from a particular input to a particular output. Switching planes 232 may generally operate by storing data into multi-port digital memories, where data may be read into the digital memories at one port and read out at another port.

As shown in FIG. 2, each of line modules 210 and tributary modules 220 may connect to each of switching planes 232. The connections between line modules 210/tributary modules 220 and switching planes 232 may be bidirectional. While a single connection is shown between a particular line module 210/tributary module 220 and a particular switching plane 232, the connection may include a pair of unidirectional connections (i.e., one in each direction).

Switching Operation of Nodes 120

Figure 3:
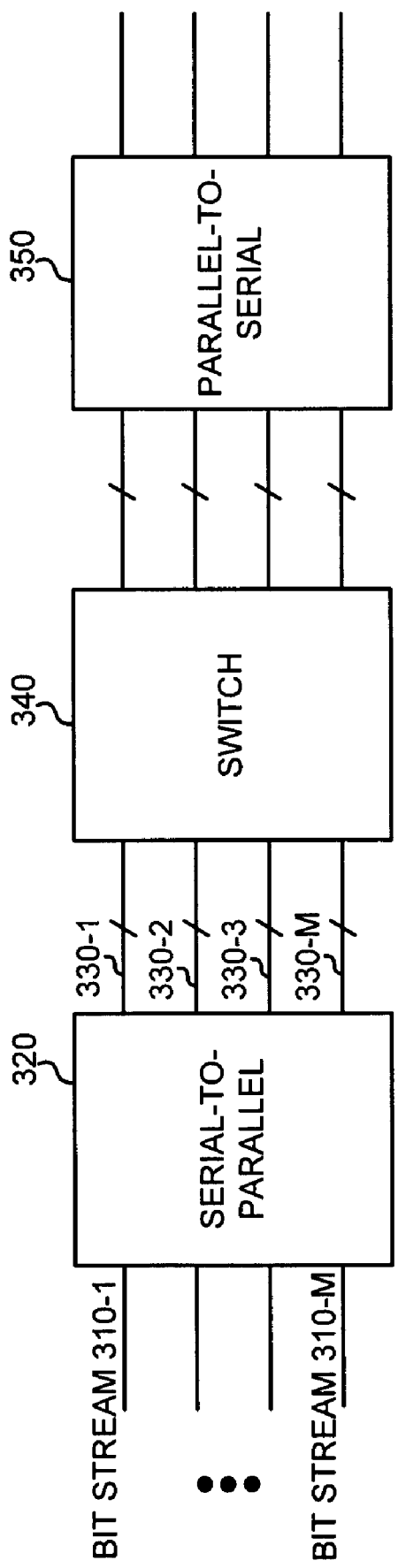
FIG. 3 is a diagram conceptually illustrating switching of data, as performed by components of the node shown in FIG. 2.

FIG. 3 is a diagram conceptually illustrating switching of data, as performed by line modules 210, tributary modules 220, and/or switching fabric 230. As shown, input data may be received as multiple independent serial bit streams 310-1 through 310-M (collectively, streams 310). Each serial bit stream may correspond to a stream received over an optical link. Each serial stream 310 may be converted to a parallel block of data (e.g., a block 20 bits wide) by serial-to-parallel component 320 to produce M output parallel streams 330-1 through 330-M (collectively, streams 310). Each block of data (called a "data unit" herein) in parallel streams 330 may be written to switch 340. Subsequently, each data unit may be read from switch 340 and converted back to its original serial stream by parallel-to-serial component 350. Data may be read at output ports of switch 340 that correspond to the egress path of the stream through node 120. In this manner, input streams may be switched to a desired output path.

In one implementation, switch 340 may be implemented as, for example, a dynamic or static random access memory that includes multiple independent read and write ports. Switch 340 may be designed to be able to simultaneously write input data at write ports and read output data from read ports.

Existing Serial-to-Parallel and Parallel-to-Serial Conversion

Figure 4:
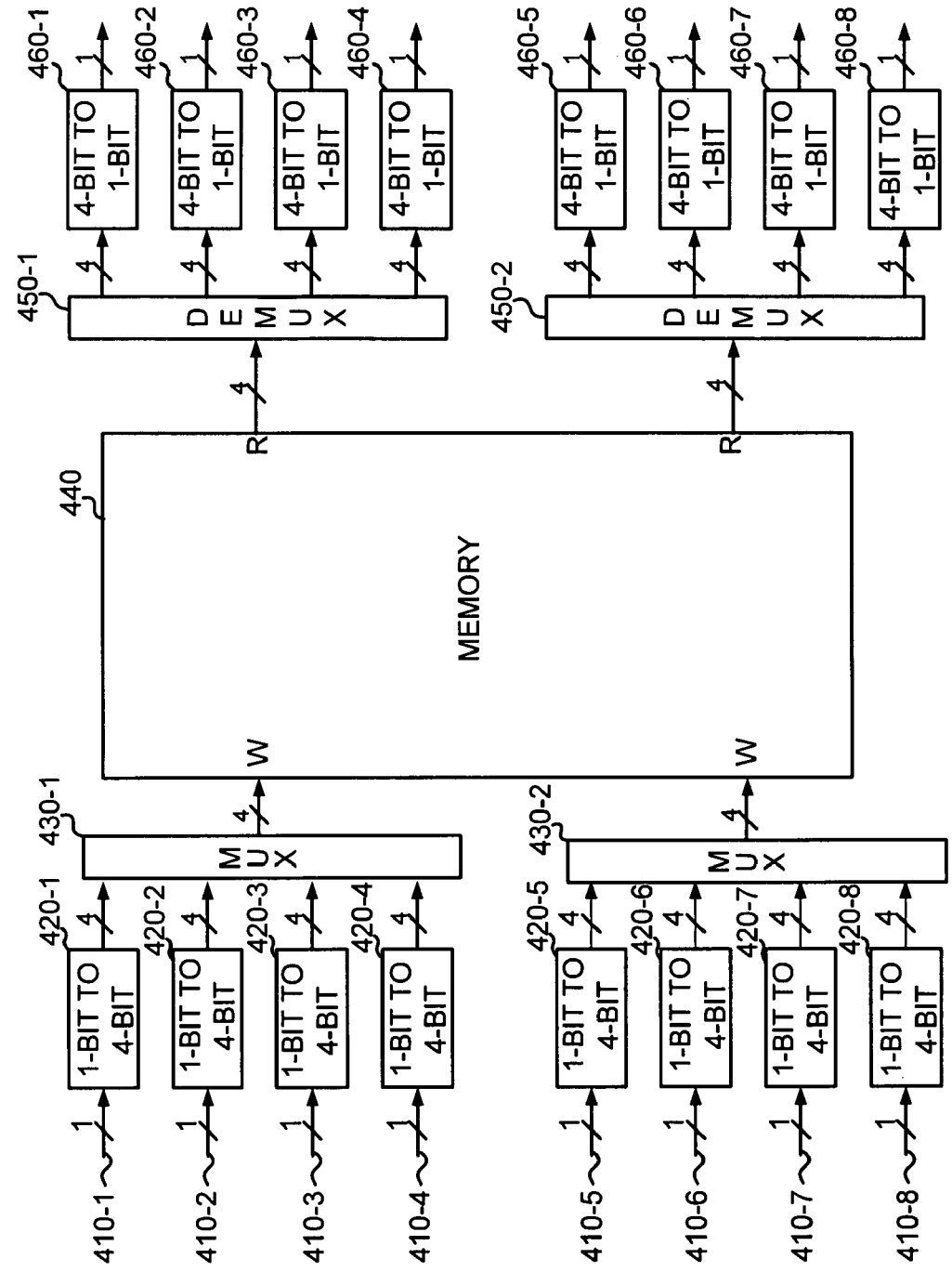
FIG. 4 is a diagram illustrating serial-to-parallel and parallel-to-serial data conversion using an existing technique.

FIG. 4 is a diagram illustrating serial-to-parallel and parallel-to-serial data conversion using an existing technique.

Eight exemplary serial data streams, 410-1 through 410-8 are shown in FIG. 4. Data streams 410 are received by 1-bit to 4-bit conversion circuits 420-1 through 420-8 to create parallel data units corresponding to data streams 410. The parallel data units are received by multiplexers 430-1 and 430-2, which may output, at each clock cycle, four parallel bits from one of streams 410 to memory 440. Memory 440 may be read by the parallel-to-serial portion of the circuit shown in FIG. 4: de-multiplexers 450-1 and 450-2 and 4-bit to 1-bit circuits 460-1 through 460-8.

The operation of the serial-to-parallel portion of the circuit shown in FIG. 4 (1-bit to 4-bit circuits 420 and multiplexers 430) includes receiving input streams 410 at 1-bit to 4-bit circuits 420. Each 1-bit to 4-bit circuit 420 may include four 1-bit registers, which, over four clock cycles, store 4 bits of data per stream. Multiplexers 430-1 and 430-2 may each include a multiplexer that selects one group of four bits from its 16 input lines. Thus, in each of four clock cycles, each of multiplexers 430 may select a different output from one of 1-bit to 4-bit circuits 420 to forward to memory 440.

Figure 5A:
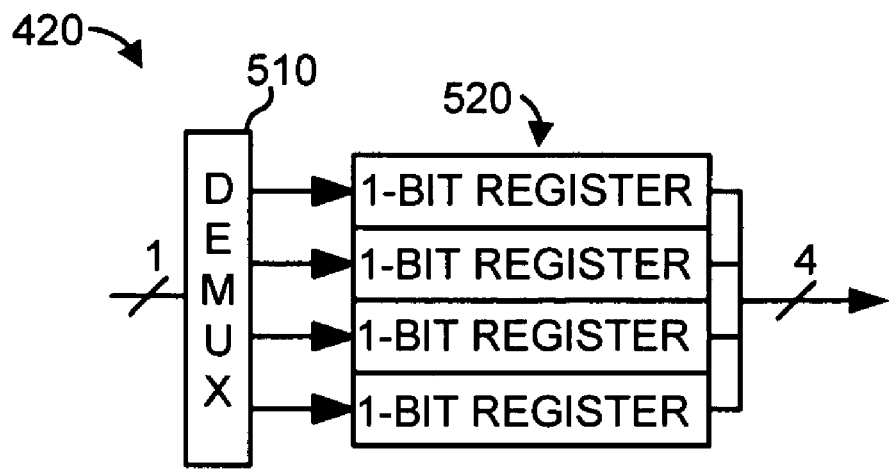
FIG. 5A is a diagram illustrating an exemplary implementation of a 1-bit to 4-bit circuit.

FIG. 5A is a diagram illustrating an implementation of one of 1-bit to 4-bit circuits 420 in additional detail. Circuit 420 may include a de-multiplexer 510 that switches its input bit to one of four 1-bit registers 520. The four bits in 1-bit register 520 may be output by 1-bit to 4-bit circuit 420.

The operation of the parallel-to-serial portion of the circuit shown in FIG. 4 (4-bit to 1-bit circuits 460 and de-multiplexers 450) is similar to the serial-to-parallel portion. Data is output to a particular output stream by reading the data unit (i.e., 4 bits) at the desired output port of memory 440. De-multiplexers 450 may each include a de-multiplexer that receives a 4 bit data unit and outputs the input 4-bits to one of four possible output groups. The data output port to use and the output of de-multiplexer 450 to select may be made based on the desired output stream for the data. The output of de-multiplexer 450 may be stored in 4-bit to 1-bit circuit 460, which may handle the final parallel to serial conversion of the data.

Figure 5B:
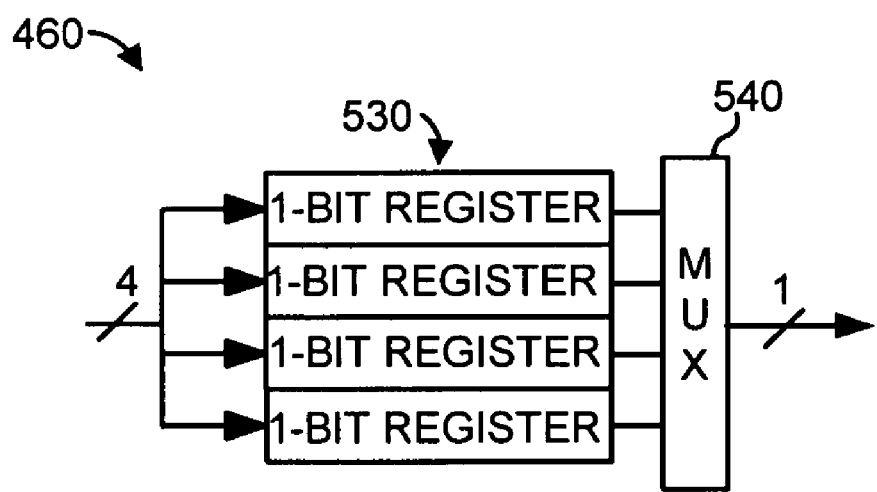
FIG. 5B is a diagram illustrating an exemplary implementation of a 4-bit to 1-bit circuit.

FIG. 5B is a diagram illustrating an implementation of one of the 4-bit to 1-bit circuits 460 in additional detail. Circuit 460 may include four one-bit registers 530 that receive, in parallel, each of the input data bits. Multiplexer 540 may select one of the four registers 530 to forward as an output of circuit 460.

Serial-to-Parallel and Parallel-to-Serial Conversion

Figure 6:
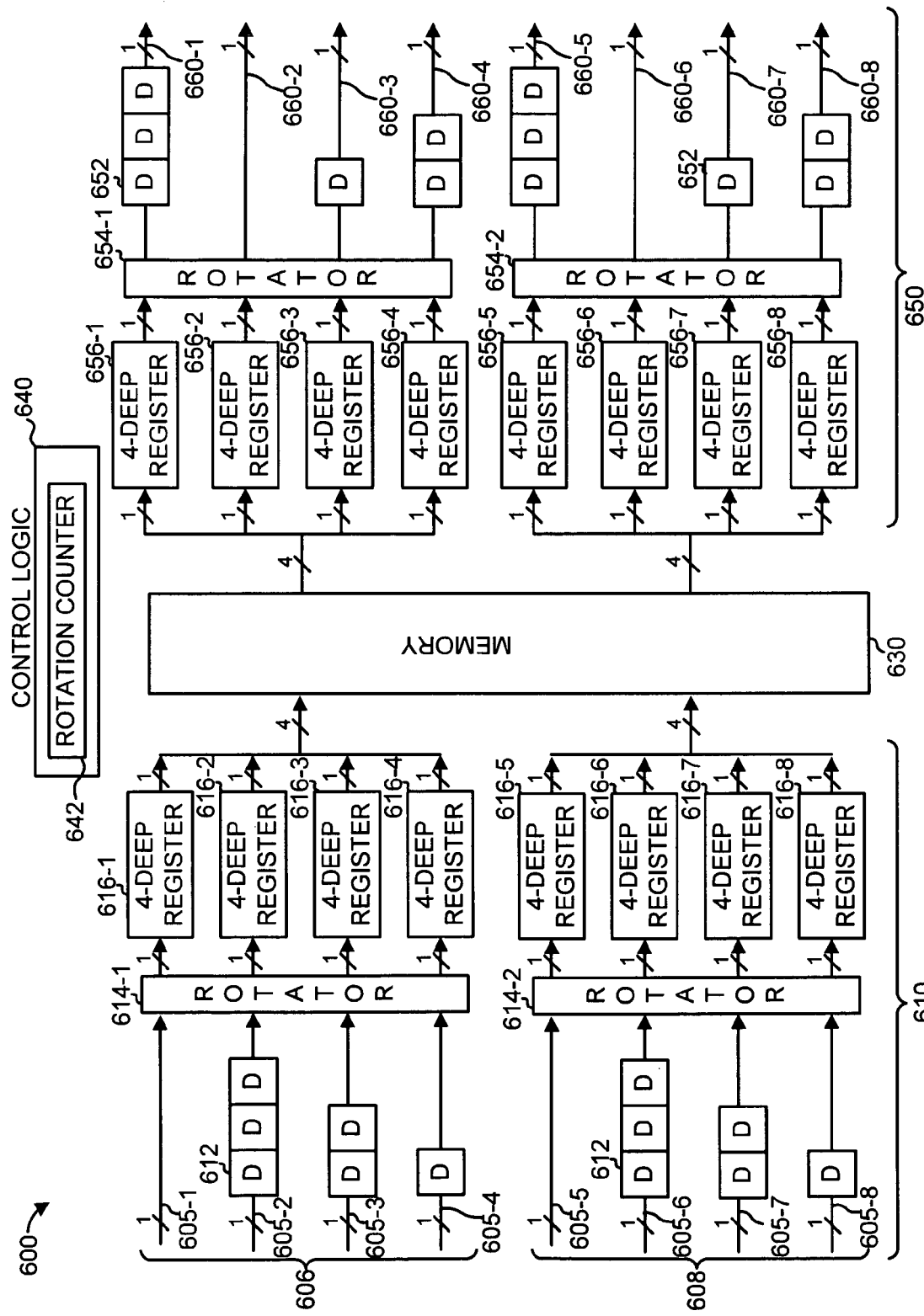
FIG. 6 is a diagram illustrating an exemplary system for switching data.

FIG. 6 is a diagram illustrating an exemplary system 600 for switching data. System 600 may include a serial-to-parallel component 610, a memory 630, control logic 640, and a parallel-to-serial component 650. Serial-to-parallel component 610, memory 630, and parallel-to-serial component 650 are generally arranged as illustrated in FIG. 3. System 600 may receive input data on input serial data streams, labeled as data streams 605-1 through 605-8, and output data on output serial data streams, labeled as output data streams 660-1 through 660-8. Serial-to-parallel component 610, control logic 640, and parallel-to-serial component 650 will now be particularly described.

Control logic 640 may generally provide address and control signals for system 600. For clarity, the address and control lines are not explicitly shown in FIG. 6. Control logic 640 may particularly include rotation counter 642. Rotation counter 642 may be a 2-bit (4 count) counter that may be used to control elements in serial-to-parallel component 610 and parallel-to-serial component 650 by repeatedly incrementing through its count values. In other implementations, in which there are a different number of input data streams 605 or a different bus width to memory 630 is used, the count of rotation counter 642 may be more than two bits.

Serial-to-parallel component 610 may include a number of delay elements 612, rotator components 614-1 and 614-2, and 4-deep register components 616-1 through 616-8. Parallel-to-serial component 650 may include delay elements 652, rotator components 654-1 and 654-2, and 4-deep register components 656-1 through 656-8.

System 600 may operate on a number of incoming serial data streams. Eight data streams 605-1 through 605-8 are shown in FIG. 6. The data streams may be divided into groups such as, as shown for system 600, groups of four data streams 606 and 608 (i.e., data streams 605-1 through 605-4 and 605-5 through 605-8). It can be appreciated that the illustrated number of data streams, the number of data streams per group, and the number of groups are exemplary. In practice, system 600 may include additional or fewer data streams, data streams per group, and number of groups. For example, in one implementation, there may be 200 data streams separated into 10 groups of 20 data streams.

Data streams 605-1 through 605-8 in group 606 may be initially delayed by delay elements 612. Each of delay elements 612 may be implemented as, for example, a capacitive delay element, a digital latch, or another delay element. Each delay element may delay its input one clock cycle. As shown in FIG. 6, data stream 605-1 is not delayed, data stream 605-2 may pass through three delay elements 612 (i.e., three clock cycles), data stream 605-3 may pass through two delay elements 612 (i.e., two clock cycles), and data stream 605-4 may pass through one delay element 612 (i.e., one clock cycle). In this manner, incoming data bits for different data streams are offset from one another when reaching rotator components 614-1. In alternative implementations, the particular arrangement of the different numbers of delay elements corresponding to each data stream 605 may be different.

In general, the implementation and operation of rotator component 614-1 and 4-deep register components 616-1 through 616-4 may be identical to that of rotator component 614-2 and 4-deep register components 616-5 through 616-8. Accordingly, in the description that follows, only the elements associated with group of data streams 606 will be discussed in detail.

Rotator component 614-1 may receive, in each clock cycle, the group of data bits (e.g., 4 bits in the illustrated implementation) from signal lines 605-1 through 605-4. Rotator component 614-1 may generally operate to "rotate" its input based on a rotate count value received from rotation counter 642. In rotating its input, rotator component 614-1 may switch signals on the four input lines to various ones of the four output lines. Which input lines get switched to which output lines may depend on the rotate count value.

Figure 7:
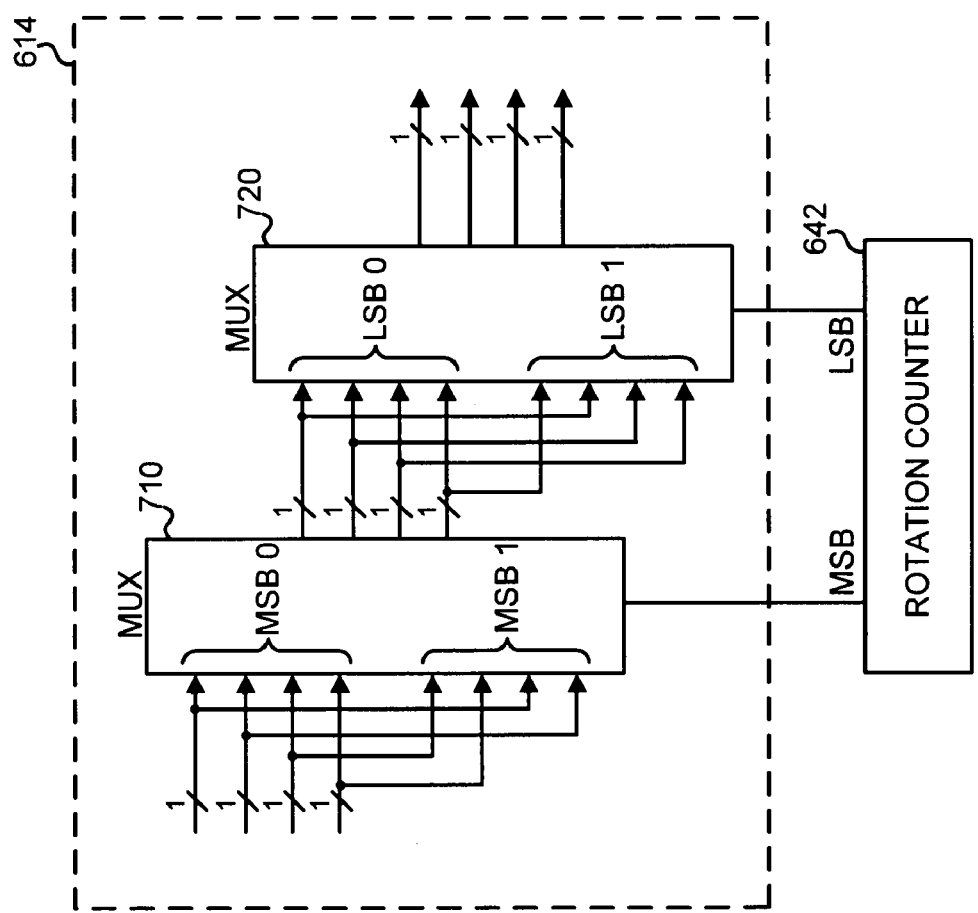
FIG. 7 is a diagram illustrating an exemplary implementation of a rotator component.

FIG. 7 is a diagram illustrating an exemplary implementation of one of rotator components 614. The four input signals received by rotator component 614 may be input to a first multiplexer 710. The output of first multiplexer 710 may be output to second multiplexer 720. Multiplexers 710 and 720 may each be eight input, four output (8:4) multiplexers. Multiplexers 710 and 720 may each receive the eight inputs, replicated into two groups of four, and output four signals (one of the two groups) based on an input control line. The input control line for multiplexer 710 may be the most significant bit (MSB) of the two-bit output of rotation counter 642 and the input control line for multiplexer 720 may be the least significant bit (LSB) of the two-bit output of rotation counter 642. In one implementation, multiplexers 710 and 720 may be implemented using eight separate 2:1 multiplexers (e.g., controlled switches).

More generally, in implementations in which the group of data streams 606 includes N data streams, rotator component 614 may receive the N inputs and implement the rotation operation using two 2*N input, N output multiplexers.

Table I, below, illustrates a rotation operation as performed by rotator component 614. In Table I, assume the input signals (data bits) to rotator component 614 are labeled "n", "p", "r", and "v". The output, rotated signals, for each of the four rotation count values are shown in the table. For example, when the rotation count equals two (i.e., MSB=1 and LSB=0), the output data bits would be rearranged into the order "r", "v", "n", "p". As can be observed in Table I, over the course of the rotation count, the signal at any particular input location is switched to be output once at each of the output locations (i.e., the input at "n" is variously output at "n", "v", "r", and "p"; the input at "p" is variously output at "p", "n", "v", and "r", etc.).

TABLE I

| | ROTATION COUNT | | | |
| --- | --- | --- | --- | --- |
| | 0 | 1 | 2 | 3 |
| | MSB = 0, | MSB = 0, | MSB = 1, | MSB = 1, |
| Inputs | LSB = 0 | LSB = 1 | LSB = 0 | LSB = 1 |
| n | n | p | r | v |
| p | p | r | v | n |
| r | r | v | n | p |
| v | v | n | p | r |

As a further example of a rotation operation performed by rotator component 614, consider four data bits labeled as bits "a", "b", "c", and "d" and received at the four input lines of rotation component 614. Assume that the rotation count is zero (MSB=0, LSB=0). When MSB=0, the output of multiplexer 710 is the same as its input, so the output of multiplexer 710 may be the four data bits in their original order (i.e., "a", "b", "c", and "d"). When LSB=0, the output of multiplexer 720 is the same as its input, so the output of multiplexer 720, and hence the output of rotator component 614, may still be the four data bits in their original order (i.e., "a", "b", "c", and "d"). Now assume that the rotation count is one (MSB=0, LSB=1). When MSB=0, the output of multiplexer 710 is the same as its input, so the output of multiplexer 710 may be the four data bits in their original order (i.e., "a", "b", "c", and "d"). When LSB=0, the output of multiplexer 720 is a rearranged version of its input in which the first value input is shifted to the last value, the second input value is shifted to first output, the third value input is shifted to second output, and the fourth value input is shifted to third output. Accordingly, the output of multiplexer 720, and hence the output of rotator component 614, may be the four data bits "b", "c", "d", and "a".

Returning to FIG. 6, 4-deep register components 616-1 through 616-4 may receive the values output from rotator component 614-1. Each of 4-deep register components 616-1 through 616-4 may include four registers to store four parallel bits. At each clock cycle, each 4-deep register component 616-1 through 616-4 may output one bit, providing, in total, a four-bit data unit to memory 630. The four-bit data unit represents four parallel bits from one of input signal lines 605.

Figure 8:
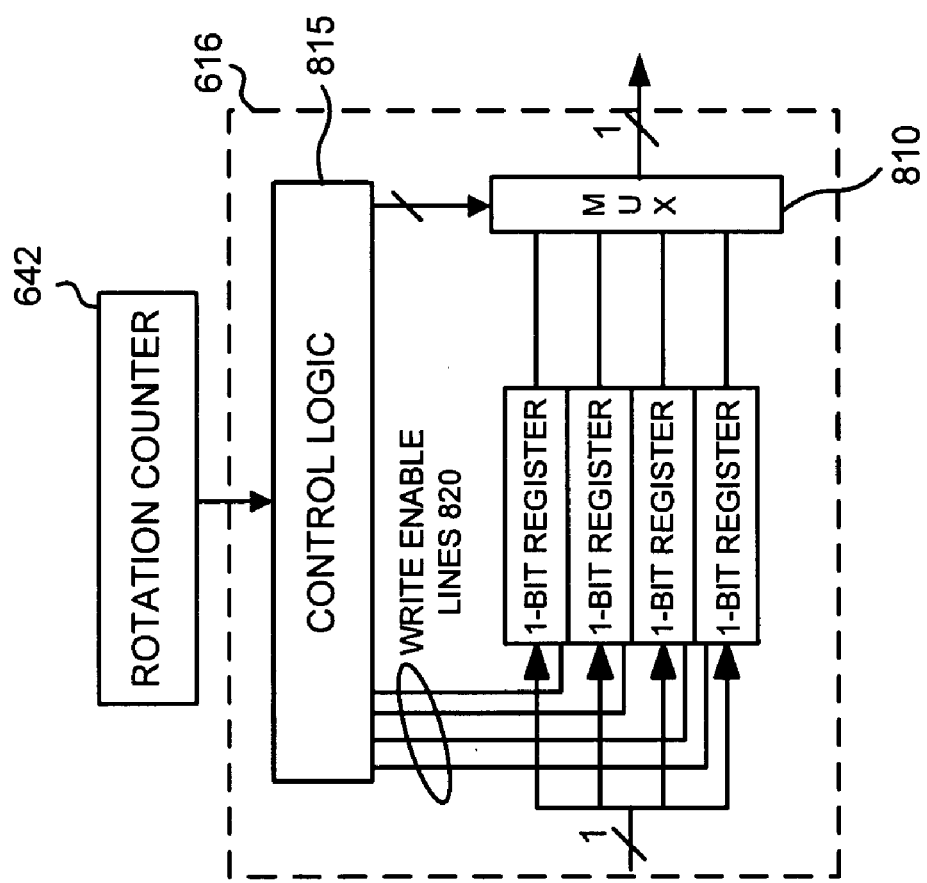
FIG. 8 is a diagram illustrating an exemplary implementation of a 4-deep register component.

FIG. 8 is a diagram illustrating an exemplary implementation of one of 4-deep register components 616. As shown, 4-deep register component 616 may include four 1-bit registers 805, each connected to one of the input signal lines and a multiplexer 810. Multiplexer 810 may include a 4:1 multiplexer that selects one of the outputs of the 1-bit registers 805 to output. 1-bit registers 805 and multiplexer 810 may be controlled by control logic 815 based on the output of rotation counter 642. In particular, control logic 815 may, in each clock cycle, enable one of 1-bit registers 805 to write its input data bit. Control logic 815 may simultaneously control multiplexer 810 to select the output of another of 1-bit registers 805 to output from 4-deep register component 616.

Referring back to FIG. 6, control logic 815 in 4-deep registers 616-1 through 616-4, may collectively control 4-deep registers 616-1 through 616-4 to simultaneously output the bits of a four-bit data unit, corresponding to four sequentially received bits on one of signal lines 605-1 through 605-4. The data unit may be stored in memory 630 at an address set by control logic 640.

In alternative implementations, 4-deep register components 616 may include additional or fewer 1-bit registers 805. For example, the number of 1-bit registers may be equal to the memory bus width to memory 630.

Parallel-to-serial component 650 generally operates to "reverse" the parallelization performed by parallel-to-serial component 610. The output of parallel-to-serial component 650, output data streams 660-1 through 660-8, may be a time-delayed version of input data streams 605-1 through 605-8. Parallel-to-serial component 650 may receive the parallel 4-bit data units from memory 630. In one implementation, the port of memory 630 from which a data unit is read may be controlled by control logic 640. Control logic 640 may additionally control 4-deep registers 656 and rotator component 654 to sequentially output the data units on one of the output signal lines.

A data unit read from memory 630 may be input to the 4-deep registers corresponding to the output signal line. As shown in system 600, for example, each of 4-deep registers 656-1 through 656-4 may receive one of the four bits in the data unit. Each of 4-deep registers 656-1 through 656-4 may also output one of its stored bits. The outputs may be rotated by rotator component 654-1 and delayed by delay elements 652.

As with delay elements 612, each of delay elements 652 may be implemented as, for example, a capacitive delay element, a digital latch, or another delay element. Each delay element 652 may delay its input one clock cycle. As shown in FIG. 6, output data stream 660-1 may pass through three delay elements 652 (i.e., delayed three clock cycles), output data stream 660-2 is not delayed, output data stream 660-3 may pass through one delay element 652 (i.e., one clock cycle), and output data stream 660-4 may pass through two delay element 652 (i.e., two clock cycles).

Rotator components 654 and 4-deep register components 656 may be constructed identically to rotator components 614 and 4-deep register components 616, respectively, and as shown in FIGS. 7 and 8.

Figure 9:
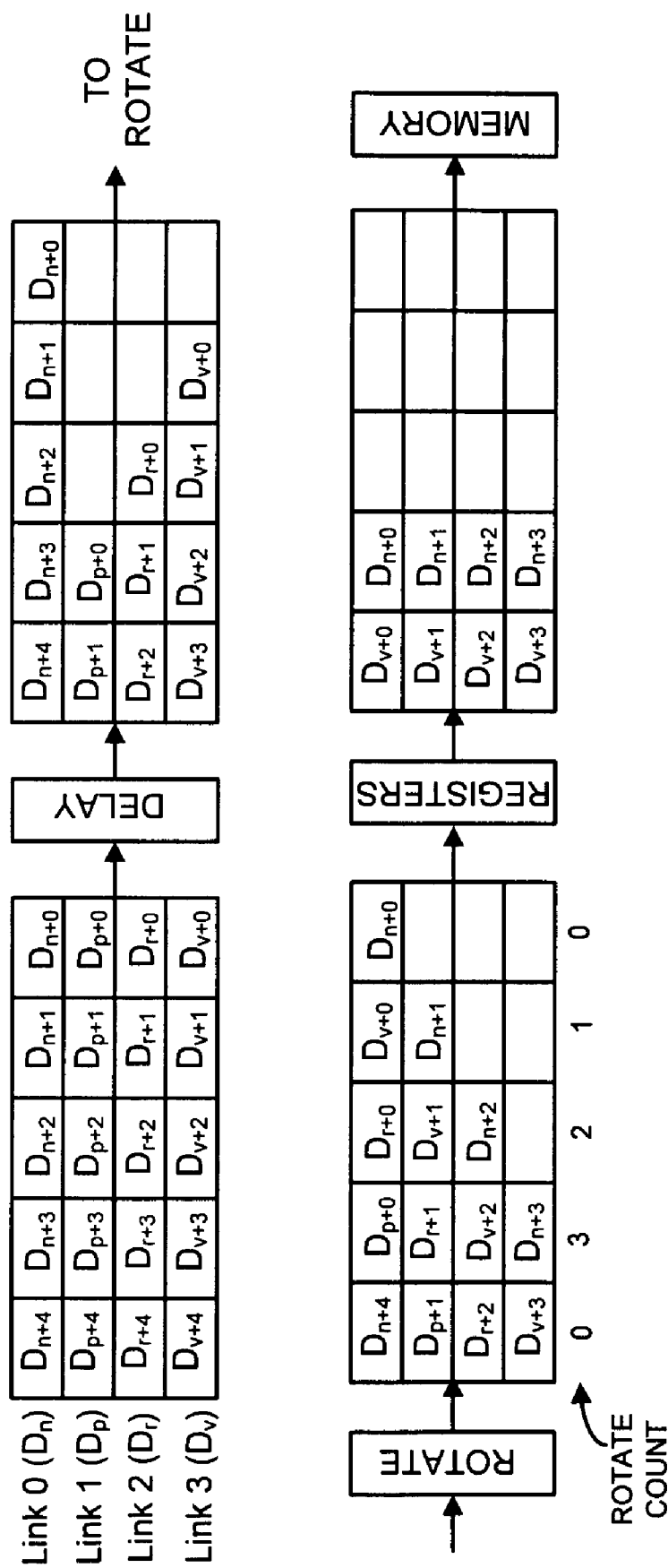
FIG. 9 is a timing diagram illustrating exemplary operation of a serial-to-parallel component.

FIG. 9 is a timing diagram illustrating exemplary operation of serial-to-parallel component 610. Four serial input signals, corresponding to input signals 605-1 through 605-4 are illustrated in FIG. 9: data signal $D_n$ (received on Link 0), data signal $D_p$ (received on Link 1), data signal $D_r$ (received on Link 2), and data signal $D_v$ (received on Link 3). A number of serial bits may be received over each link. For data signal $D_n$, for example, the first received bit is shown as $D_{n-0}$, the second received bit is shown as $D_{n+1}$, etc. Similar notation is used for data signals $D_p$, $D_r$, and $D_v$. In the timing boxes shown in FIG. 9, relative timing relationships of the data signals are shown as the signal progresses through serial-to-parallel component 610.

After processing by delay elements 612 ("DELAY"), the data signals will be staggered. $D_n$, which is not delayed, is unchanged, while signal $D_v$, for example, is delayed one clock cycle. Signals $D_p$ and $D_r$ are correspondingly delayed three clock cycles and two clock cycles, respectively.

After processing by rotator 614 ("ROTATE"), the data signal timings may be rearranged as shown. As can be seen, after rotation, each four-bit group of bits for a particular sample (e.g., $D_{n+0}$, $D_{n+1}$, $D_{n+2}$, and $D_{n+3}$) are placed on different paths. Because of this, a different 4-deep register 616-1 through 616-4 may receive each bit of the data group.

After processing by 4-deep registers 616 ("REGISTERS"), the data signals may be further arranged as shown, in which four successive bits of a particular data signal are arranged in parallel with one another. These parallel data units may then be written to memory 630 as a single data unit.

Figure 10:
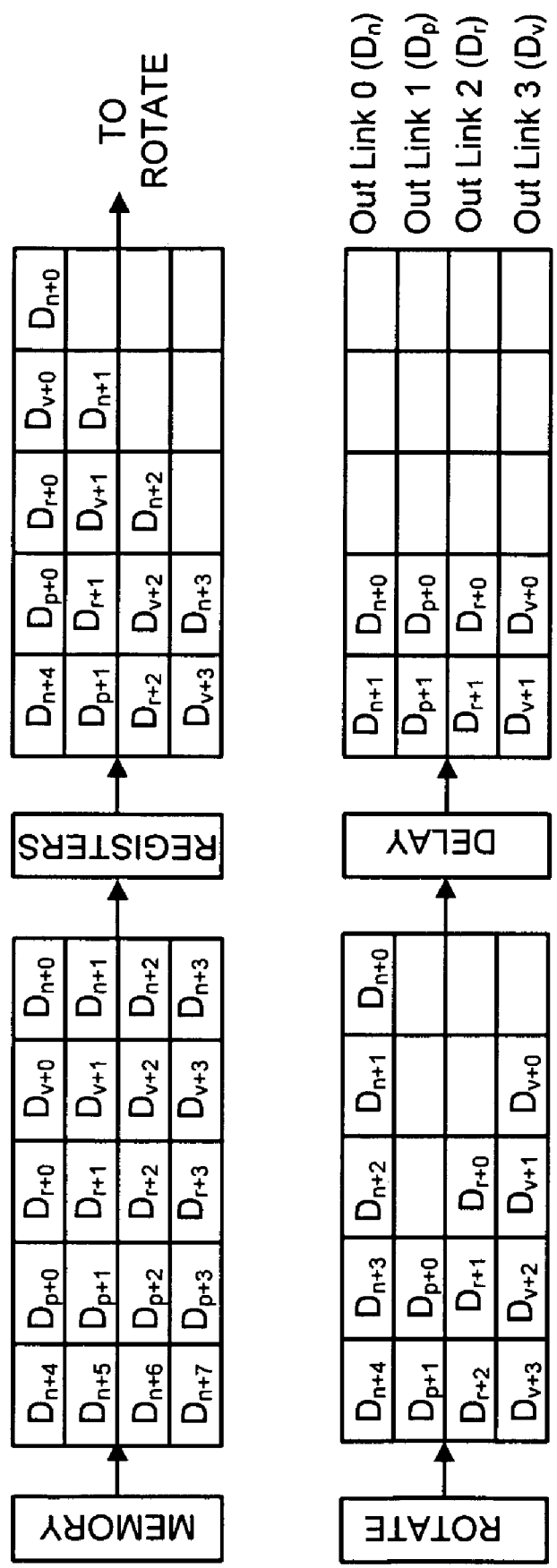
FIG. 10 is a timing diagram illustrating exemplary operation of a parallel-to-serial component.

FIG. 10 is a timing diagram illustrating exemplary operation of parallel-to-serial component 650. As shown, the signals may be output from memory 630 as parallel units of data. After processing by 4-deep registers 656 ("REGISTERS"), the data signals may be staggered as shown. Rotator 654 ("ROTATE") may rotate the staggered signals to re-serialize the signals. The serialized signals may then be delayed by delay elements 652 ("DELAY") to establish the original relative timing between the bits in different signals.

Serial-to-parallel component 610 and parallel-to-serial component 620 may efficiently perform serial-to-parallel and parallel-to-serial conversion. For instance, in existing serial-to-parallel systems, such as the one shown in FIG. 4, multiplexers 430 may each be multiplexers that have a number of inputs equal to the memory width times the number of input streams. This can result in a relatively large number of signal lines and a complicated circuit layout. In contrast, with multiplexers 710 and 720, for instance, a reduced number of inputs are needed (e.g., twice the memory width).

In general, the parallel data units output by serial-to-parallel component 610 and the serial data streams output by parallel-to-serial component 650 may be used in any application that requires parallel/serial conversion. The switch shown in system 600 is one exemplary application.

Memory

Memory 630 may be a multi-port memory that acts as a frame buffer in a switch. As a frame buffer, memory 630 may store data units for a complete frame before the frame is read out of memory 630. In other implementations, memory 630 may be a multi-port memory used in the context of other applications.

Figure 11:
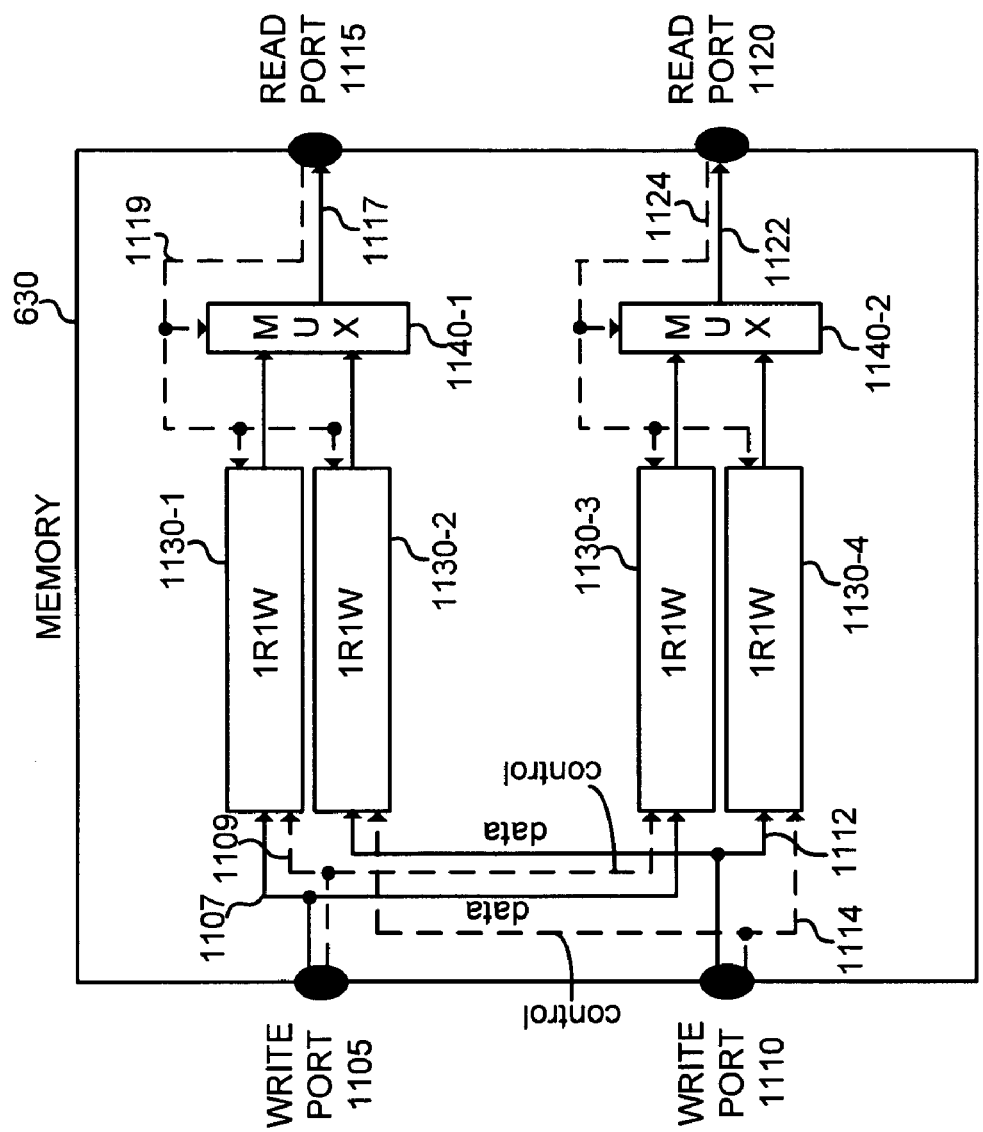
FIG. 11 is a diagram illustrating an exemplary implementation of a memory.

FIG. 11 is a diagram illustrating an exemplary implementation of memory 630. Memory 630 may include two write ports 1105 and 1110, and two read ports 1115 and 1120. Each of write ports 1105 and 1110 may act as an independent port through which data units can be written to memory 630. During a write cycle, both ports 1105 and 1110 (or one of ports 1105 or 1110) can be used to independently write data units to memory 630. That is, a first data unit may be written to memory 630 through port 1105 and a second data unit may be written to memory 630 through port 1110.

Data lines and control lines may be associated with each port of memory 630. Data lines are shown in FIG. 11 as solid lines and control lines are shown as dashed lines. Write port 1105, for instance, is associated with data lines 1107 and control lines 1109. Data lines 1107 may include a number of lines equal to the width of the memory port. In system 600, for example, each write port may include four data lines. Control lines 1109 may include address lines used to receive the address at which the data is written and a write enable line used to control when writing is enabled. Write port 1110 may include a similar set of data lines 1112 and control lines 1114.

Read ports 1115 and 1120 may also be associated with data and control lines. For read port 1115, the output data units may be transmitted over data lines 1117. Input control lines 1119 may be used to provide a read address and a read enable signal. Similarly, for read port 1120, the output data units may be transmitted over data lines 1122. Input control lines 1124 may be used to provide the read address and a read enable signal.

Signals on the control lines for the read and write ports may be generated by control logic 640.

Multi-port memory 630 may include a number of one-read-one-write (1R1W) memories 1130-1 through 1130-4. Memories 1130 may be thought of as being logically grouped (groups 1130-1, 1130-2; and 1130-3, 1130-4) into a number of groups equal to the number of write ports or read ports. For the memories within a group, each write port may write to one memory in the group and all the memories in a group may be read by a single read port. With this construction, any read port may read the data written at any of the write ports. This may be a particularly useful feature for a non-blocking switch, in which data units may be written at any write port and read out at any read port.

One-read-one-write memories are generally known in the art and may be typically available in standard circuit design libraries. In a 1R1W memory, a data unit may be written to the memory at one address while another data unit may be simultaneously read from the memory at another address.

Memory 630 may also include multiplexers 1140-1 and 1140-2. Multiplexer 1140-1 may receive a data unit output from 1R1W 1130-1 and a data unit output from 1R1W 1130-

2. Multiplexer 1140-1 may select one of the data units, based on a signal from control line 1119, to output at read port 1115. Multiplexer 1140-2 may receive a data unit output from 1R1W 1130-3 and a data unit output from 1R1W 1130-4. Multiplexer 1140-2 may select one of the data units, based on a signal from control line 1124, to output at read port 1120.

In the operation of memory 630, data units may be received at write ports 1105 and 1110. Each data unit received at write port 1105 may be written to the same address in two 1R1W memories: 1R1W 1130-1 and 1R1W 1130-3. Similarly, each data unit received at write port 1115 may be written to the same address in two 1R1W memories: 1R1W 1130-2 and 1R1W 1130-4.

Concurrently with the writing of data units to memory 630, data units may be read at read ports 1115 and 1120. An address received at read port 1115 may be applied to both of memories 1130-1 and 1130-2. The address may be further used to control multiplexer 1140-1 to select one of the data units. Similarly, an address received at read port 1120 may be applied to both of memories 1130-3 and 1130-4. The address may be further used to control multiplexer 1140-2 to select one of the data units.

With memory 630, multiple 1R1W memories can be used to construct a multi-port memory. In the example of FIG. 6, a 2R2W memory is implemented using four 1R1W memories.

Although memory 630 is shown in FIG. 11 as a 2R2W memory, in alternative implementations, memory with additional ports may be constructed. In general, for memory 630, the number of 1R1W memory groups and the number of 1R1W memories in each group may be equal to the number of write or read ports. Additionally, one multiplexer may be used for each group to connect one of the 1R1W memories in a group to the output port.

Figure 12:
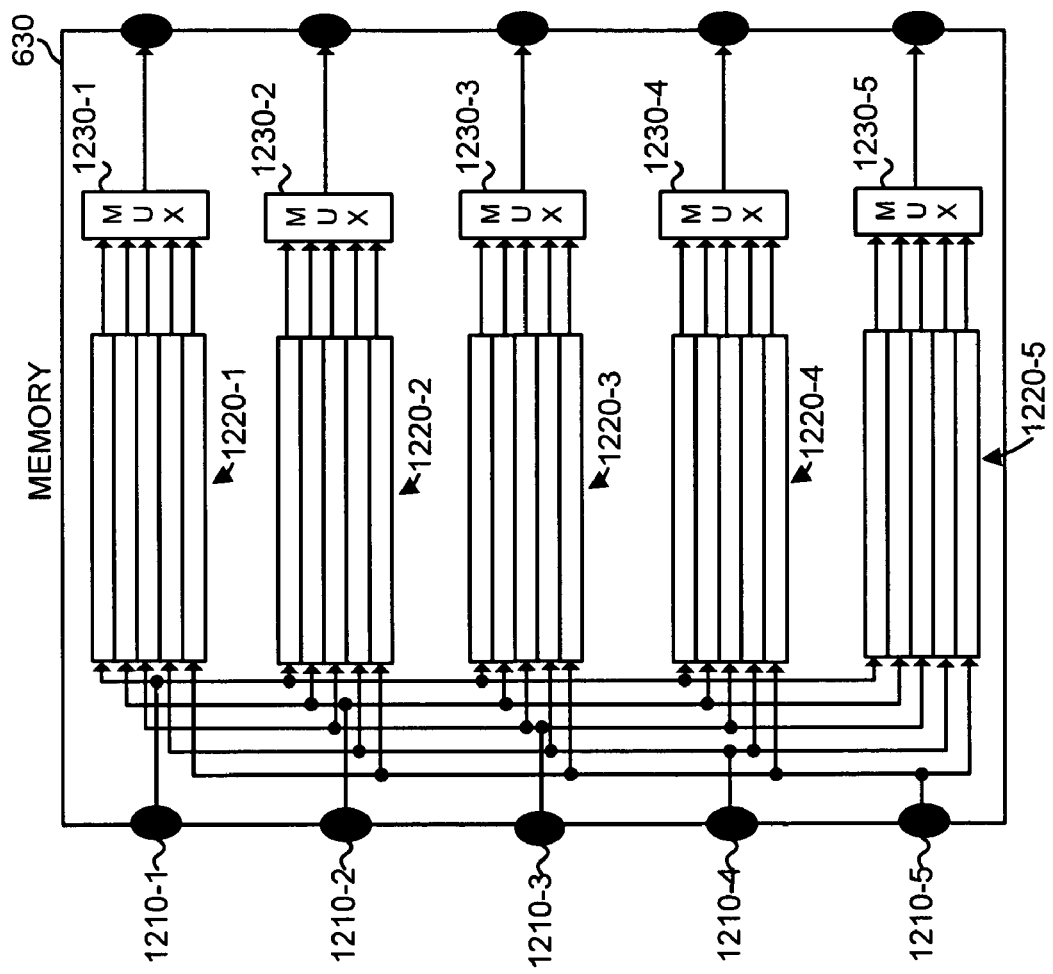
FIG. 12 is a diagram illustrating another implementation of a memory.

FIG. 12 is a diagram illustrating another implementation of memory 630, in which memory 630 implements a 5R5W memory. Five write ports 1210-1 through 1210-5 may connect to five 1R1W memory groups 1220-1 through 1220-5. For clarity, only data paths are shown in FIG. 12. Each memory group 1220 may include five 1R1W memories. Each memory in each memory group 1220 may connect to a corresponding multiplexer 1230-1 through 1230-5.

In one implementation, the memory width of the 1R1W memories may be 10 bits (i.e., the data unit size is 10 bits) and each of the 1R1W memories may include approximately 1600 addressable data units.

Multi-port memory 630, as described above, was constructed from a number of standard "building block" 1R1W memories. The concepts discussed with respect to FIGS. 11 and 12 may be similarly applied to form multi-port non-blocking memories in which multi-port building block memories are used to create a multi-port memory with a greater number of ports than the building block multi-port memories.

Figure 13:
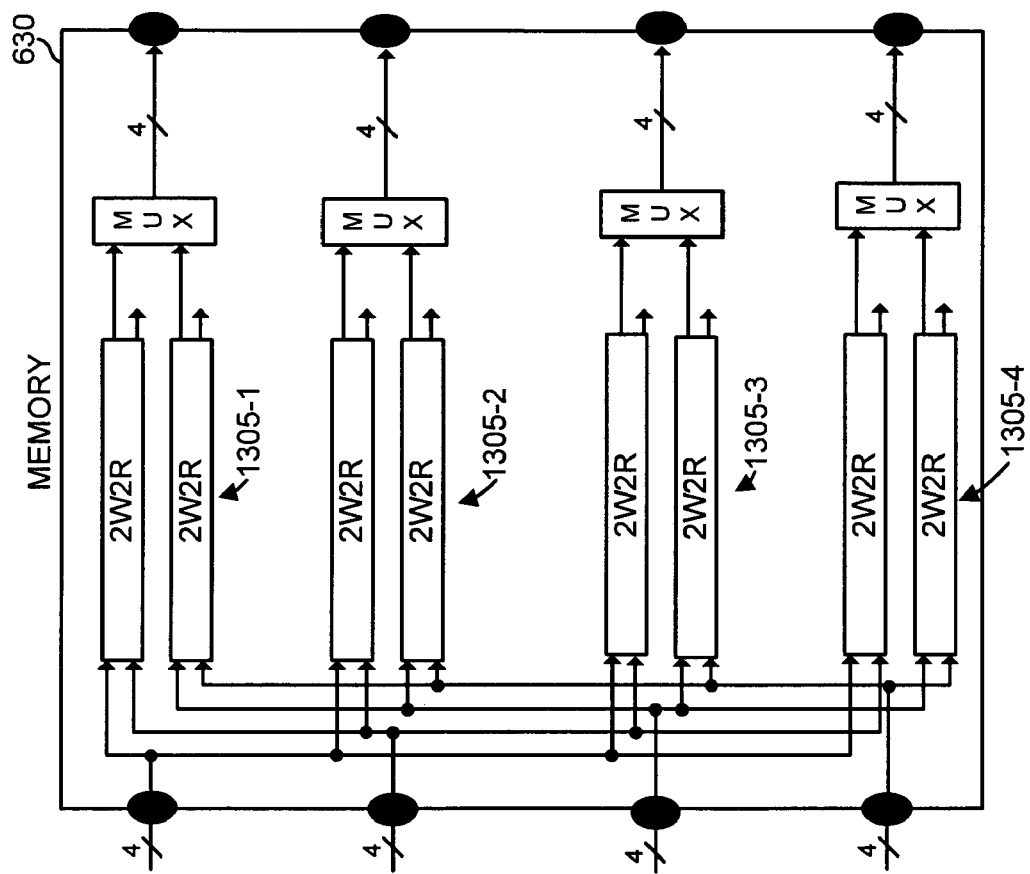
FIG. 13 is a diagram illustrating another implementation of a memory.

FIG. 13 is a diagram illustrating an exemplary implementation of memory 630 in which eight two-write-two-read (2W2R) memories are used to create a four-write-four-read (4W4R) multi-port memory. Four memory groups 1305-1 through 1305-4, each including two 2W2R memories may be used. Each input port may write to a 2W2R memory in each group 1305. Because each 2W2R memory includes two write ports, two input ports may write to each 2W2R memory. Similarly, at the output of each group 1305, data units may be read from each 2W2R memory, resulting in up to four data units being input to each multiplexer, which may select one of the up to four input data units to output to its corresponding output port. In the implementation show, only one read port of each 2W2R memories is used, resulting in an implementation in which each multiplexer selects one of its two input data units.

Alternative Implementations of Switch 340

Switch 340 was generally described above as a multi-port memory that is used with the serial-to-parallel and parallel-to-serial components. In alternative implementations, switch 340 may be implemented differently. FIGS. 14-17 are diagrams illustrating exemplary alternative implementations of switch 340. In these diagrams, serial-to-parallel components 1410 and parallel-to-serial components 1420 are shown interacting with a switch 1415. Each serial-to-parallel component 1410 may correspond to, as shown in FIG. 6, delay elements 612, rotator 614-1, and 4-deep register components 616-1 through 616-4. Similarly, each parallel-to-serial component 1420 may correspond to, as shown in FIG. 6, 4-deep register components 656-1 through 656-4, rotator 654-1, and delay elements 652.

Figure 14:
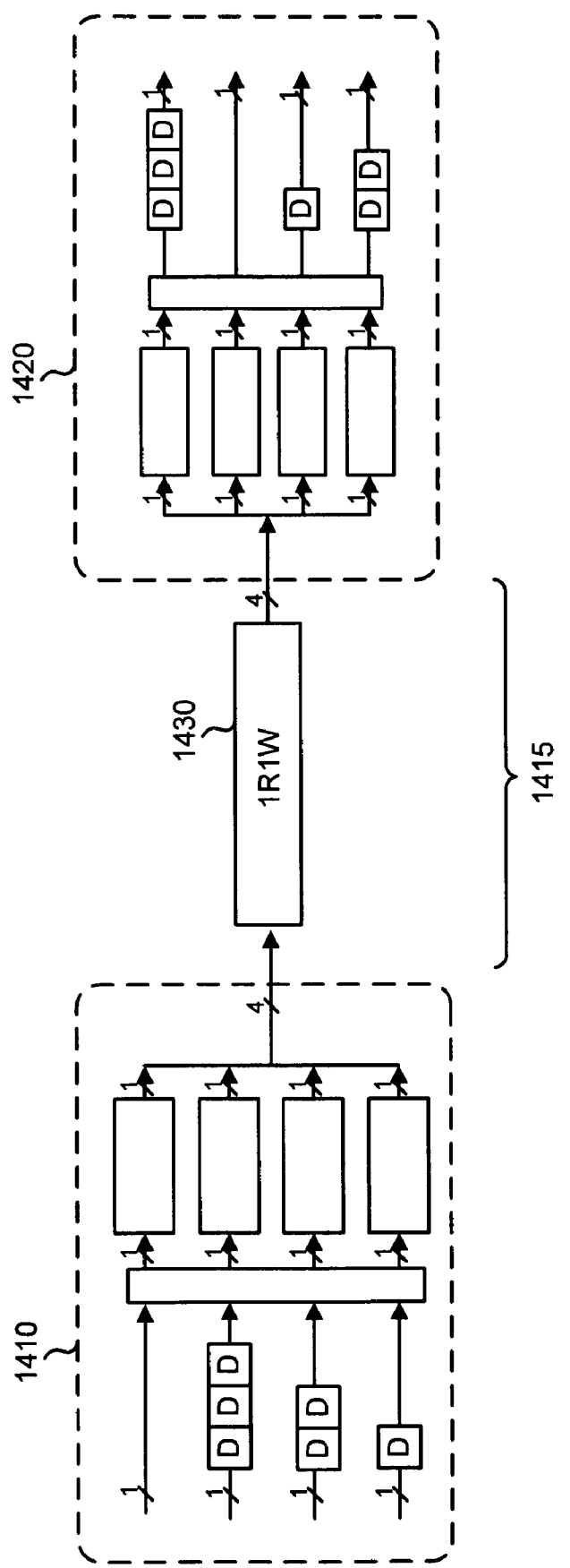
FIG. 14 is a diagram illustrating an first exemplary alternative implementation of a switch.

As shown in FIG. 14, switch 1415 may include a single 1R1W memory 1430. In this example, 1R1W memory 1430 may function as a simple buffer memory.

Figure 15:
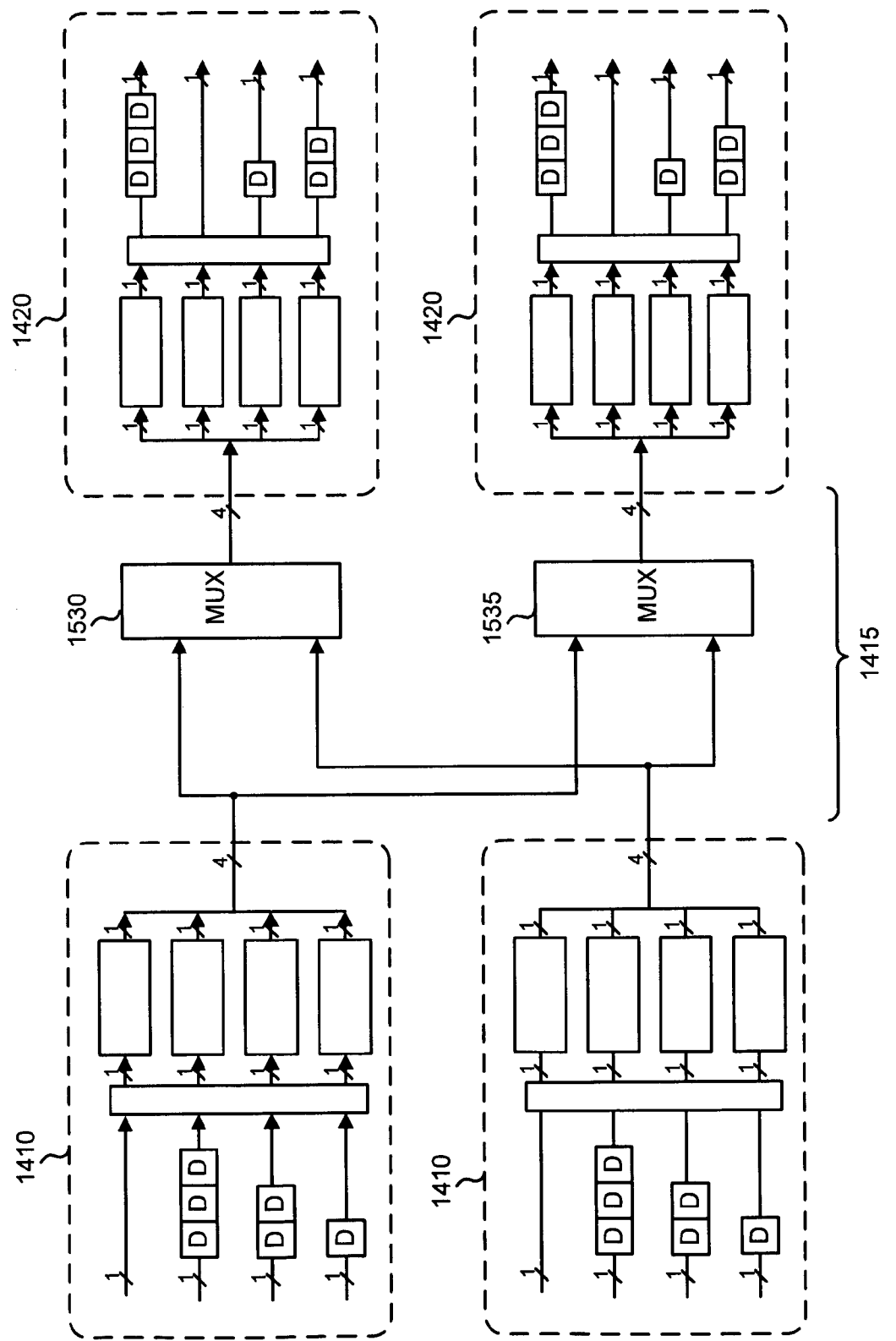
FIG. 15 is a diagram illustrating a second exemplary alternative implementation of a switch.

As shown in FIG. 15, switch 1415 may be implemented as a pair of multiplexers 1530 and 1535. With multiplexers 1530 and 1535, parallel data units output from serial-to-parallel components 1410 may be selectively switched to one of parallel-to-serial components 1420.

Figure 16:
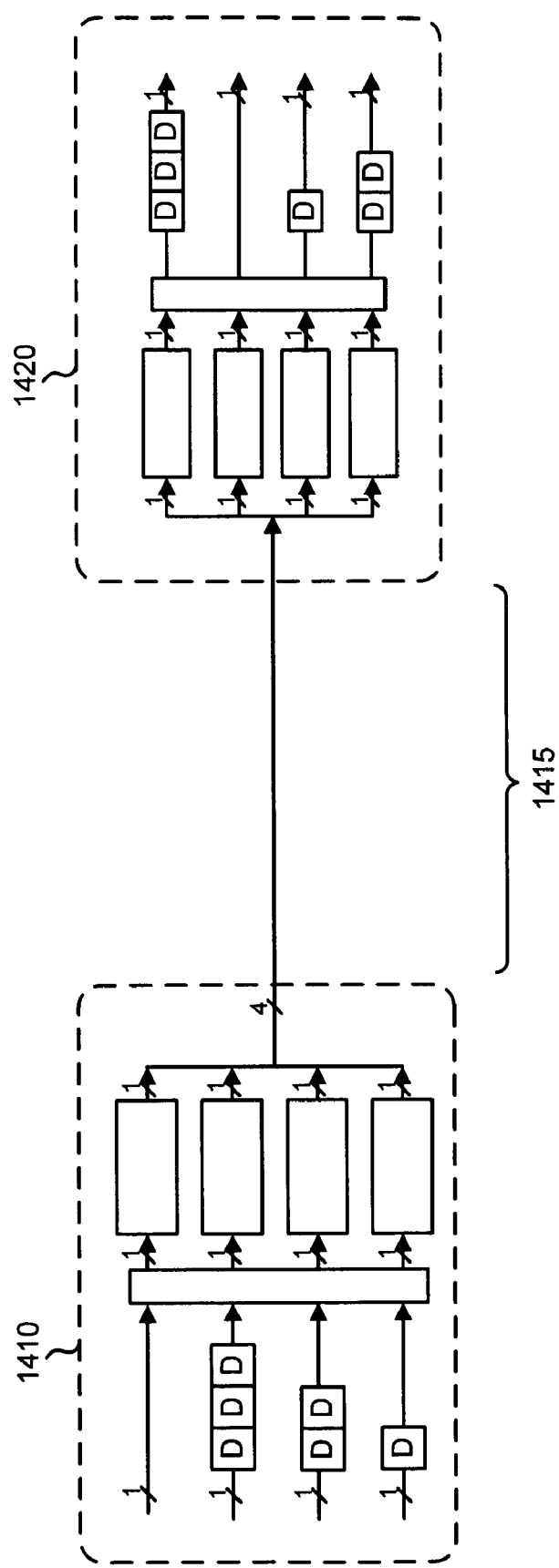
FIG. 16 is a diagram illustrating a third exemplary alternative implementation of a switch.

As shown in FIG. 16, switch 1415 may be implemented as a simple pass through bus. Here, the rotators within serial-to-parallel component 1410 and parallel-to-serial component 1420 may be used to switch the input serial data streams to different corresponding output serial data streams.

Figure 17:
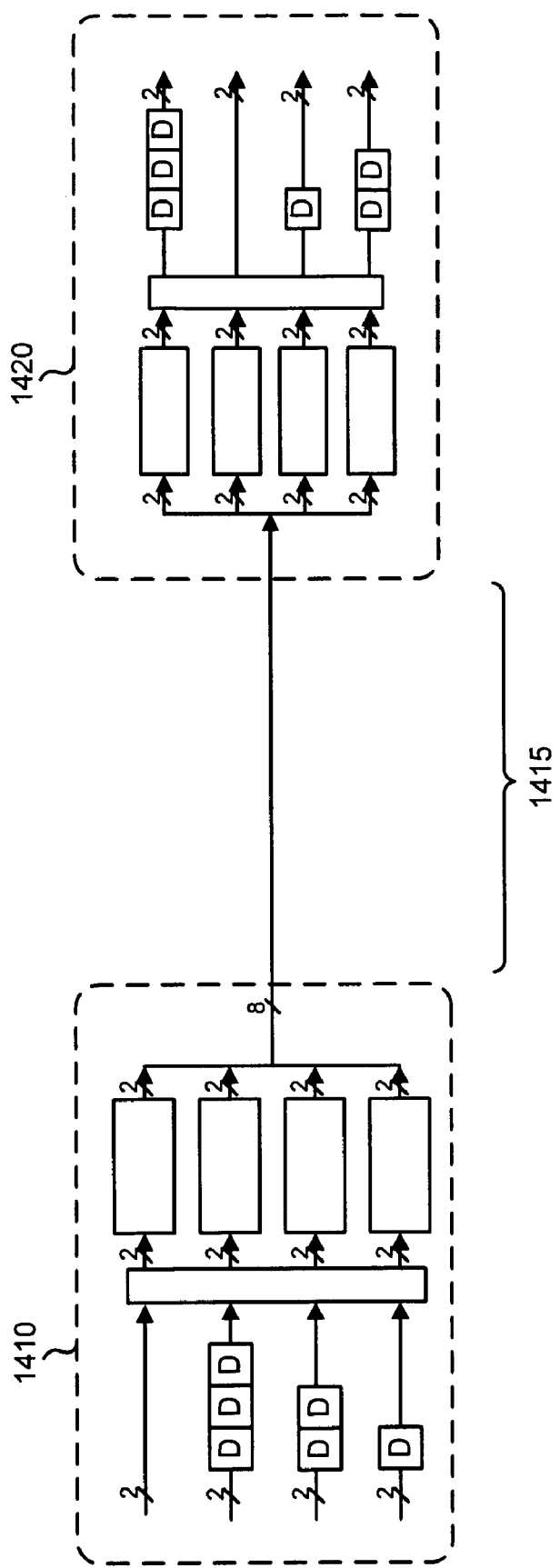
FIG. 17 is a diagram illustrating a fourth exemplary alternative implementation of a switch.

As shown in FIG. 17, switch 1415 may be implemented as a simple pass through bus. The switching may be accomplished by configuration of the pass through bus. In this example, each input and output serial stream is shown as a two-bit wide serial stream, creating a 4-bit wide switch bus width. Equivalently, this can be conceptualized as two parallel one-bit wide implementations, such as is shown in FIG. 16.

CONCLUSION

The foregoing description provides illustration and description, but is not intended to be exhaustive or to limit the invention to the precise form disclosed. Modifications and variations are possible in light of the above teachings or may be acquired from practice of the invention.

Also, certain portions of the implementations have been described as "components" that perform one or more functions. The term "component," may include hardware, such as a processor, an application specific integrated circuit (ASIC), or a field programmable gate array (FPGA), or a combination of hardware and software.

Further, while implementations have been described in the context of an optical network, this need not be the case. These implementations may apply to any form of circuit-switching network.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A serial-to-parallel conversion circuit, comprising:
   a plurality of inputs, each of which being configured to receive a corresponding one of a plurality of serial data streams, each of the plurality of serial data streams including a corresponding one of a plurality of data units that each include a plurality of bits;
   a plurality of delay circuits, each of which being configured to receive a corresponding one of the plurality of serial data streams;
   a rotator circuit configured to receive the plurality of serial data streams, each of the plurality of serial data streams being delayed relative to one another by a corresponding one of a plurality of delay times associated with the plurality of delay circuits, the rotator circuit having a plurality of outputs, where each of the plurality of bits within each of the plurality of the data units is supplied to a corresponding one of the plurality of outputs of the rotator circuit; and
   a plurality of register circuits receiving the plurality of data units of the plurality of serial data streams, the plurality of register circuits being configured to output, in parallel, said each of the plurality of bits within said each of the plurality of data units.

2. The device of claim 1, where the plurality of register circuits each further include:
   a plurality of storage registers; and
   a multiplexer connected to receive outputs of the plurality of storage registers and to output a bit stored in one of the plurality of storage registers.

3. The device of claim 2, where the plurality of register circuits each further include:
   control logic to selectively enable or disable the plurality of storage registers.

4. The device of claim 2, where each of the plurality of storage registers are 1-bit storage registers.

5. The device of claim 1, where the rotator circuit further includes:
   a first multiplexer connected to two groups of input signals, the first group of input signals corresponding to the plurality of delayed serial data streams and the second group of input signals corresponding to a rearranged version of the plurality of delayed serial data streams, the first multiplexer outputting one of the first or second groups of input signals; and
   a second multiplexer connected to a third group of input signals corresponding to the output of the first multiplexer and a fourth group of input signals corresponding to a rearranged version of the output of the first multiplexer, the second multiplexer outputting one of the third or fourth groups of input signals.

6. The device of claim 5, where the rotator circuit further includes:
   a first control signal line corresponding to a most significant bit of a count signal, the first control signal controlling the first multiplexer; and
   a second control signal line corresponding to a least significant bit of the count signal, the second control signal controlling the second multiplexer.

7. The device of claim 1, where the delay circuits for each of the plurality of serial data streams implements a delay of between zero and N–1 clock cycles, where N equals a number of the plurality of inputs.

8. A parallel-to-serial conversion circuit, comprising:
   an input configured to receive a parallel data unit that includes a plurality of bits;
   a plurality of register circuits to each receive one of the plurality of bits of the data unit, store the bit, and output a second, previously received, bit;
   a rotator circuit configured to receive the output bits from the plurality of register circuits, the rotator circuit having a plurality of outputs, where each of the plurality of bits within the parallel data unit is supplied sequentially to one of the plurality of outputs of the rotator circuit, to thereby provide a plurality of serial data streams; and
   a plurality of delay circuits, each of which being connected to a corresponding one of the plurality of outputs of the rotator circuit, and each of the plurality of delay circuits receiving a corresponding one of the plurality of serial data streams and each of the plurality of delay circuits outputting said corresponding one of the plurality of serial data streams;
   control logic to generate a count signal to control the plurality of registers and the rotator circuit,
   where the control logic further includes:
   a counter to generate the count signal, the counter repeatedly incrementing through count values corresponding to the count signal, and
   where the rotator circuit further includes:
   a first multiplexer receives two groups of input signals, the first group of input signals corresponding to the output bits from the plurality of register circuits and the second group of input signals corresponding to a rearranged version of the plurality of inputs, the first multiplexer outputting one of the first or second groups of input signals; and
   a second multiplexer connected to a third group of input signals corresponding to the output of the first multiplexer and a fourth group of input signals corresponding to a rearranged version of the output of the first multiplexer, the second multiplexer outputting one of the third or fourth groups of input signals.

9. The device of claim 8, where the rotator circuit further includes:
   a first control signal line corresponding to a most significant bit of a count signal, the control signal line connecting to a control input of the first multiplexer; and
   a second control signal line corresponding to a least significant bit of the count signal, the control signal line connecting to a control input of the second multiplexer.

10. A parallel-to-serial conversion circuit, comprising:
   an input configured to receive a parallel data unit that includes a plurality of bits;
   a plurality of register circuits to each receive one of the plurality of bits of the data unit, store the bit, and output a second, previously received, bit;
   a rotator circuit configured to receive the output bits from the plurality of register circuits, the rotator circuit having a plurality of outputs, where each of the plurality of bits within the parallel data unit is supplied sequentially to one of the plurality of outputs of the rotator circuit, to thereby provide a plurality of serial data streams; and
   a plurality of delay circuits, each of which being connected to a corresponding one of the plurality of outputs of the rotator circuit, and each of the plurality of delay circuits receiving a corresponding one of the plurality of serial data streams and each of the plurality of delay circuits outputting said corresponding one of the plurality of serial data streams, where the plurality of delay circuits implement delays of between zero and N−1 clock cycles, where N is equal to a number of the plurality of outputs of the rotator circuit.

11. A parallel-to-serial conversion circuit, comprising:

an input configured to receive a parallel data unit that includes a plurality of bits;

a plurality of register circuits to each receive one of the plurality of bits of the data unit, store the bit, and output a second, previously received, bit;

a rotator circuit configured to receive the output bits from the plurality of register circuits, the rotator circuit having a plurality of outputs, where each of the plurality of bits within the parallel data unit is supplied sequentially to one of the plurality of outputs of the rotator circuit, to thereby provide a plurality of serial data streams; and a plurality of delay circuits, each of which being connected to a corresponding one of the plurality of outputs of the rotator circuit, and each of the plurality of delay circuits receiving a corresponding one of the plurality of serial data streams and each of the plurality of delay circuits outputting said corresponding one of the plurality of serial data streams, where the plurality of register circuits each further include:

a plurality of storage registers; and a multiplexer connected to receive outputs of the plurality of storage registers and to output a bit stored in one of the plurality of storage registers, and where the plurality of register circuits each additionally include:

register component control logic to receive a rotation count, and based on the rotation count, selectively enable or disable write enable signals to each of the plurality of storage registers.

12. A switch comprising:

a plurality of input signal lines to carry serial data;

a serial-to-parallel conversion component including:

a rotator circuit connected to the plurality of input signal lines and to output a corresponding plurality of rotator output signal lines, the rotator circuit switching signals on the input signal lines to various ones of the rotator output signal lines, a plurality of register circuits each connected to one of the rotator output signal lines, store a bit received on the one of the rotator output signal lines, and output a second, previously received, bit from the rotator circuit;

a memory to receive outputs from the plurality of registers and store the outputs from the plurality of registers as a parallel data unit; and a parallel-to-serial conversion component including:

a second plurality of register components to each receive a bit from a parallel data unit output from the memory, store the bit, and output a second, previously received, bit, and a second rotator circuit to receive the bits output from the second plurality of register circuits on a plurality of second rotator input signal lines and output a corresponding plurality of second rotator output signal lines, the second rotator component switching signals on the second rotator input signal lines to various ones of the plurality of second rotator output signal lines, where the second rotator component output signal lines each output, over multiple clock cycles, serialized versions of parallel data units.

13. The switch of claim 12, further including:

control logic to output control signals to control the parallel-to-serial conversion component, the memory, and the parallel-to-serial conversion component.

14. The switch of claim 12, where the control logic further includes:

a counter to generate the count signal, the counter repeatedly incrementing through count values corresponding to the count signal.

15. The switch of claim 12, where the switch performs electrical switching in a node in an optical network.

16. The switch of claim 12, where the rotator component and the second rotator component each further includes:

a first multiplexer connected to receive a group of input signals, the first multiplexer outputting one of either the first group of input signals or a second group of input signals that represents a rearranged version of the first group of input signals; and a second multiplexer connected to receive a third group of input signals corresponding to the output of the first multiplexer and a fourth group of input signals corresponding to a rearranged version of the output of the first multiplexer, the second multiplexer outputting one of the third or fourth groups of input signals.

17. A device comprising:

a plurality of input signal lines to carry serial data;

a rotator circuit connected to the plurality of input signal lines and connected to output a corresponding plurality of rotator output signal lines, the rotator component switching signals on the input signal lines to various ones of the rotator output signal lines; and a plurality of register circuits each connected to one of the rotator output signal lines, the plurality of register circuits each storing a value received on the one of the rotator output signal lines;

a multiplexer having a plurality of inputs, each of which being coupled to a corresponding one of the plurality of the plurality of register circuits, the multiplexer having an output that supplies a second, previously received, value from the rotator circuit, where the plurality of register circuits collectively output, at a particular clock cycle, a parallel data unit corresponding to a plurality of stored values received on one of the plurality of input signal lines; and a plurality of delay components connected to the plurality of input signals lines and to selectively delay the serial data carried on the plurality of input signal lines, the delayed serial data being provided to the rotator circuit.

* * * * *